（12） United States Patent
Mani et al.

(10) Patent No.: US 9,305,797 B2
(45) Date of Patent: Apr. 5, 2016

(54) POLYSILICON OVER-ETCH USING HYDROGEN DILUTED PLASMA FOR THREE-DIMENSIONAL GATE ETCH

(71) Applicant: Applied Materials, Inc., Santa Clara, CA (US)

(72) Inventors: Radhika C. Mani, San Jose, CA (US); Nicolas Gani, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/155,571

(22) Filed: Jan. 15, 2014

(65) Prior Publication Data

US 2014/0199849 A1 Jul. 17, 2014

Related U.S. Application Data

(60) Provisional application No. 61/753,726, filed on Jan. 17, 2013.

(51) Int. Cl.
*H01L 21/302* (2006.01)
*H01L 21/308* (2006.01)
*H01L 21/3065* (2006.01)
*H01L 21/3213* (2006.01)
*H01L 21/28* (2006.01)
*H01L 29/66* (2006.01)

(52) U.S. Cl.
CPC ...... *H01L 21/3081* (2013.01); *H01L 21/28123* (2013.01); *H01L 21/3065* (2013.01); *H01L 21/32137* (2013.01); *H01L 21/32139* (2013.01); *H01L 29/66795* (2013.01)

(58) Field of Classification Search
CPC .............. H01L 21/3065; H01L 21/308; H01L 21/3081; H01L 21/311; H01L 21/31053; H01L 21/31116; H01L 21/31144
USPC ......... 438/706, 710, 712, 714, 720, 725, 736, 438/719

See application file for complete search history.

(56) References Cited

U.S. PATENT DOCUMENTS

| | | | |
|---|---|---|---|
| 6,576,536 B1 * | 6/2003 | Babcock | 438/585 |
| 2005/0054209 A1 * | 3/2005 | Hsu et al. | 438/725 |
| 2005/0118755 A1 * | 6/2005 | Lin et al. | 438/197 |
| 2005/0205862 A1 * | 9/2005 | Koemtzopoulos et al. | 257/40 |
| 2009/0311856 A1 * | 12/2009 | Kim | 438/589 |

* cited by examiner

*Primary Examiner* — Lan Vinh
(74) *Attorney, Agent, or Firm* — Blakely Sokoloff Taylor Zafman LLP (57) ABSTRACT

Methods of polysilicon over-etch using hydrogen diluted plasma for three-dimensional gate etch are described. In an example, a method of forming a three-dimensional gate structure includes performing a main plasma etch on a masked polysilicon layer formed over a semiconductor fin. The method also includes, subsequently, performing a plasma over etch on the masked polysilicon layer based on a plasma generated from gaseous composition including hydrogen gas ($H_2$).

14 Claims, 6 Drawing Sheets

POLYSILICON OVER-ETCH USING HYDROGEN DILUTED PLASMA FOR THREE-DIMENSIONAL GATE ETCH

CROSS-REFERENCE TO RELATED APPLICATIONS

This application claims the benefit of U.S. Provisional Application No. 61/753,726, filed on Jan. 17, 2013, the entire contents of which are hereby incorporated by reference herein.

BACKGROUND

1) Field

Embodiments of the present invention pertain to the field of semiconductor processing and, in particular, to methods of polysilicon over-etch using hydrogen diluted plasma for three-dimensional gate etch.

2) Description of Related Art

For the past several decades, the scaling of features in integrated circuits has been the driving force behind an ever-growing semiconductor industry. Scaling to smaller and smaller features enables increased densities of functional units on the limited real estate of semiconductor chips. For example, shrinking transistor size allows for the incorporation of an increased number of logic and memory devices on a microprocessor, lending to the fabrication of products with increased complexity. Scaling has not been without consequence, however. As the dimensions of the fundamental building blocks of microelectronic circuitry are reduced and as the sheer number of fundamental building blocks fabricated in a given region is increased, the performance requirements of the materials used in these building blocks have become exceedingly demanding. One example is the change from planar devices to three-dimensional devices in complimentary metal-oxide-semiconductor (CMOS) transistors.

SUMMARY

Embodiments described herein are directed to methods of polysilicon over-etch using hydrogen diluted plasma for three-dimensional gate etch.

In an embodiment, a method of forming a three-dimensional gate structure includes performing a main plasma etch on a masked polysilicon layer formed over a semiconductor fin. The method also includes, subsequently, performing a plasma over etch on the masked polysilicon layer based on a plasma generated from gaseous composition including hydrogen gas ($H_2$).

In another embodiment, a method of etching a sample in an etch chamber involves introducing a substrate into an etch chamber, the substrate including a hardmask layer disposed on a polysilicon layer disposed over a plurality of semiconductor fins. The method also involves, in a first operation in the etch chamber, etching the hardmask layer to provide a patterned hardmask layer disposed on the polysilicon layer. The method also involves, in a second operation in the etch chamber, performing a main plasma etch on a polysilicon layer having the patterned hardmask thereon. The method also involves, in a third operation in the etch chamber, performing a plasma over etch on the polysilicon layer having the patterned hardmask thereon to form a three-dimensional gate structure. The plasma over etch is based on a plasma generated from gaseous composition including hydrogen gas ($H_2$).

In another embodiment, a non-transitory machine-accessible storage medium has instructions stored thereon which cause a data processing system to perform a method of forming a three-dimensional gate structure. The method involves performing a main plasma etch on a masked polysilicon layer formed over a semiconductor fin. The method also includes, subsequently, performing a plasma over etch on the masked polysilicon layer based on a plasma generated from gaseous composition including hydrogen gas ($H_2$).

DETAILED DESCRIPTION

Methods of polysilicon over-etch using hydrogen diluted plasma for three-dimensional gate etch are described. In the following description, numerous specific details are set forth, such as specific plasma treatments and effects for forming three-dimensional semiconductor structures, in order to provide a thorough understanding of embodiments of the present invention. It will be apparent to one skilled in the art that embodiments of the present invention may be practiced without these specific details. In other instances, well-known aspects, such as photolithography patterning and development techniques for mask formation, are not described in detail in order to not unnecessarily obscure embodiments of the present invention. Furthermore, it is to be understood that the various embodiments shown in the Figures are illustrative representations and are not necessarily drawn to scale.

One or more embodiments described herein relate to etching of silicon gate structures on top of oxide or other dielectric materials. Specific embodiments are directed to three-dimensional gate etch processes, such as applicable to finfet-gate etch processes.

Generally, etching requirements for three-dimensional gate structures such as finfet structures can include a need to clear significant (e.g., 20 to 50 nanometers) polycrystalline silicon (polysilicon) while maintaining high selectivity to an underlying gate dielectric material and the fin material. It can be particularly challenging to maintain a vertical polysilicon gate profile between the fin without undercutting the top polysilicon gate. Traditionally, a HBr/$O_2$/He based plasma process has been used at high pressures to gain selectivity to gate dielectric materials (e.g., selectivity to silicon oxide). However, in order to achieve vertical profiles for a finfet gate, extended process times or increase bias conditions may be required. Such etch requirements usually result in fin bending or undercutting of a top gate profile. Thus, for such an application, lowering ion energy while maintaining etch directionality can be important. For example, a lower self-bias (Vdc) on the wafer can be achieved using a pulsed plasma along with the traditional $HBr/O_2/He$ plasma etch chemistry. However, helium (He) dilution can lead to an increase in ion bombardment, which can limit the bias applied to achieve vertical gate profiles. In accordance with an embodiment of the present invention, in order to address such issues, hydrogen is added in place of He in an over etch (OE) process to reduce the Vdc further and to achieve a vertical silicon profile in, e.g., a finfet gate etch.

Figure 1:
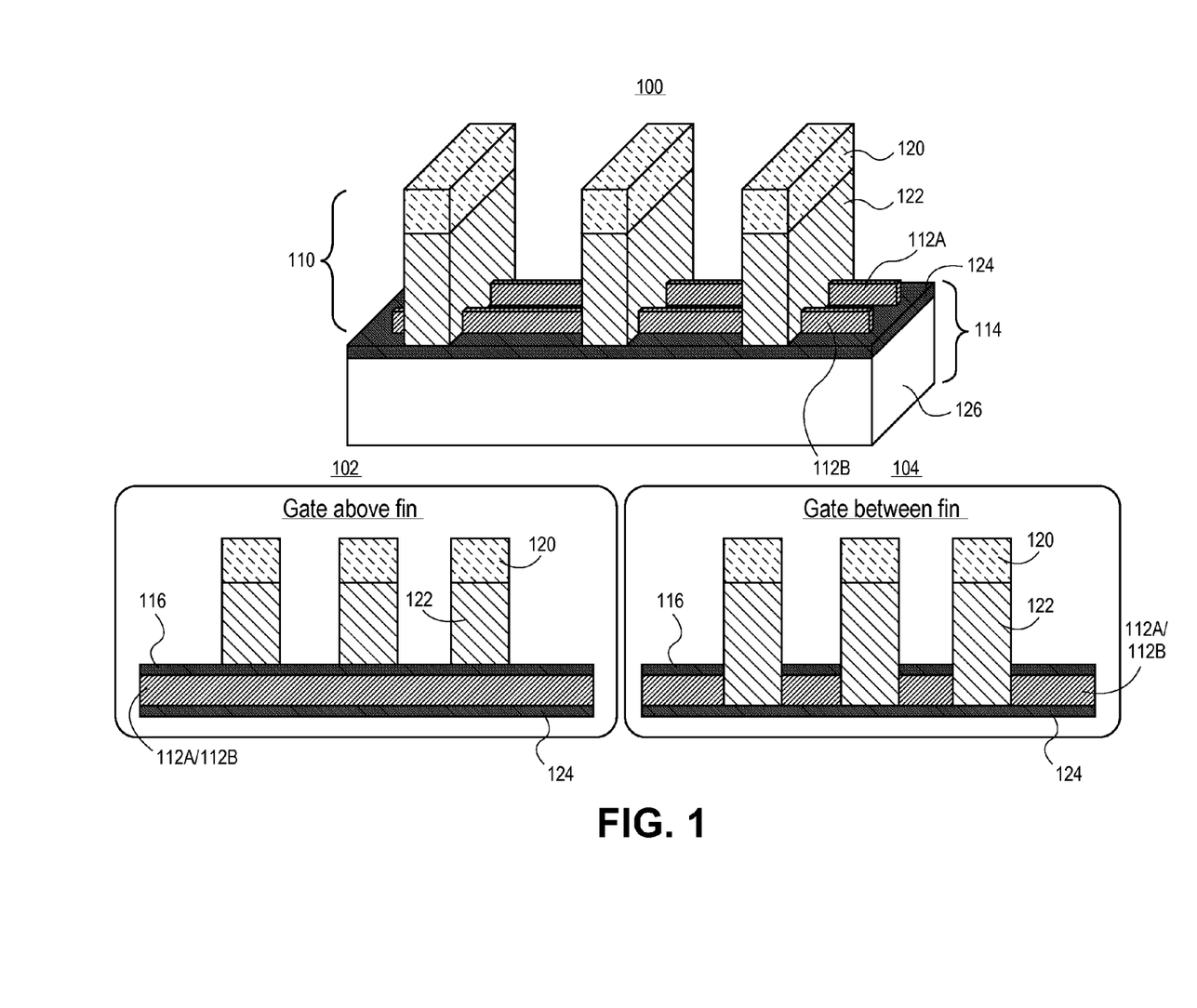
FIG. 1 illustrates an angled three-dimensional view of a gate stack on a fin structure, along with a corresponding cross-sectional view taken through the fin and a corresponding cross-sectional view taken between fins, in accordance with an embodiment of the present invention.

By way of example, FIG. 1 illustrates an angled three-dimensional view 100 of a gate stack on a fin structure, along with a corresponding cross-sectional view 102 taken through the fin and a corresponding cross-sectional view 104 taken between fins, in accordance with an embodiment of the present invention. Referring to FIG. 1, a gate stack 110 is disposed over fins 112A and 112B disposed on a substrate 114.

Referring to FIG. 1, the gate stack 110 includes a mask 120 and an etched gate electrode 122. The gate electrode 122 may be a permanent or placeholder gate electrode. In the latter case, gate electrode 122 may be composed of a material suitable for patterning and for ultimate selective removal in a replacement gate integration scheme. In one embodiment, gate electrode 122 is composed of a semiconductor material such as, but not limited to, poly-crystalline silicon, doped poly-crystalline silicon, amorphous silicon, doped amorphous silicon or a silicon-germanium alloy.

Substrate 114 may be composed of a material suitable for semiconductor device fabrication. In one embodiment, substrate 114 is a bulk substrate composed of a single crystal of a material which may include, but is not limited to, silicon, germanium, silicon-germanium or a III-V compound semiconductor material. In another embodiment, substrate 114 includes a bulk layer with a top epitaxial layer. In a specific embodiment, the bulk layer is composed of a single crystal of a material which may include, but is not limited to, silicon, germanium, silicon-germanium, a III-V compound semiconductor material and quartz, while the top epitaxial layer is composed of a single crystal layer which may include, but is not limited to, silicon, germanium, silicon-germanium and a III-V compound semiconductor material. In another embodiment, substrate 114 includes a top epitaxial layer (e.g., from which fins 112A and 112B are formed) on a middle insulator layer 124 which is above a lower bulk layer 126, as shown on the example of FIG. 1. The top epitaxial layer (and, hence, resulting fins 112A/112B) is composed of a single crystal layer which may include, but is not limited to, silicon (i.e. to form a silicon-on-insulator (SOI) semiconductor substrate), germanium, silicon-germanium and a III-V compound semiconductor material. The insulator layer 124 is composed of a material which may include, but is not limited to, silicon dioxide, silicon nitride and silicon oxy-nitride. The lower bulk layer 126 is composed of a single crystal which may include, but is not limited to, silicon, germanium, silicon-germanium, a III-V compound semiconductor material and quartz. Substrate 114 may further include dopant impurity atoms.

Referring again to FIG. 1, the gate stack 110 can further include a gate dielectric layer 116. Gate dielectric layer 116 may be composed of a material suitable to electrically isolate a gate electrode from fins 112A/112B. In one embodiment, gate dielectric layer 116 is formed by a thermal oxidation process or a chemical vapor deposition process and is composed of a material such as, but not limited to, silicon dioxide or silicon oxy-nitride. In another embodiment, gate dielectric layer 116 is formed by atomic layer deposition and is composed of a high-k dielectric material such as, but not limited to, hafnium oxide, zirconium oxide, hafnium silicate, hafnium oxy-nitride or lanthanum oxide. In an alternative embodiment, gate dielectric layer 116 is a placeholder gate dielectric layer and has a thickness sufficiently thick to act as an etch stop during the subsequent removal of a placeholder gate electrode, yet sufficiently thin for removal with substantial selectivity to fins 112A/112B. In a specific alternative embodiment, gate dielectric layer 116 is a placeholder gate dielectric layer composed of silicon dioxide and has a thickness approximately in the range of 2-5 nanometers.

In an embodiment, mask 120 of gate stack 110 is maintained during etching of the material of gate electrode 122. In one such embodiment, mask 110 is a hard mask composed of a material which may include, but is not limited to, silicon dioxide, silicon nitride and silicon oxy-nitride. In another such embodiment, mask 120 is a photoresist layer composed of a material suitable for use in a lithographic process. That is, in an embodiment, the photoresist layer is exposed to a light source and subsequently developed. In one embodiment, the portions of the photoresist layer to be exposed to the light source will be removed upon developing the photoresist layer, e.g., the photoresist layer is composed of a positive photoresist material. In a specific embodiment, the photoresist layer is composed of a positive photoresist material such as, but not limited to, a 248 nanometer node resist, a 193 nanometer node resist, a 157 nanometer node resist, an extreme ultra-violet (EUV) resist, or a phenolic resin matrix with a diazonaphthoquinone sensitizer. In another embodiment, the portions of the photoresist layer to be exposed to the light source will be retained upon developing the photoresist layer, e.g., the photoresist layer is composed of a negative photoresist material. In a specific embodiment, the photoresist layer is composed of a negative photoresist material such as, but not limited to, poly-cis-isoprene and poly-vinyl-cinnamate.

Although described above as a finfet device, the etch and/or over etch processing using hydrogen gas as a diluent as described below may be applicable to structures requiring patterning over at least some level of topography. For example, devices based on gate structures wrapping around at least a portion of a semiconductor body may be patterned, including over etching in this way. For sake of convenience, these devices are referred to herein as finfet devices.

Etch processing to fabricated silicon-based gate structures for three-dimensional type devices can, in an embodiment, be performed in a plasma etch chamber. For example, in one embodiment, one or more of the above processes is performed in an Applied Centura® Enabler dielectric etch system, available from Applied Materials of Sunnyvale, Calif., USA. In another embodiment, one or more of the above processes is performed in an Applied Materials™ AdvantEdge G3 etcher or in an Applied Materials™ C3 dielectric chamber, also available from Applied Materials of Sunnyvale, Calif., USA. The specific processes are described in greater detail below.

Figure 2:
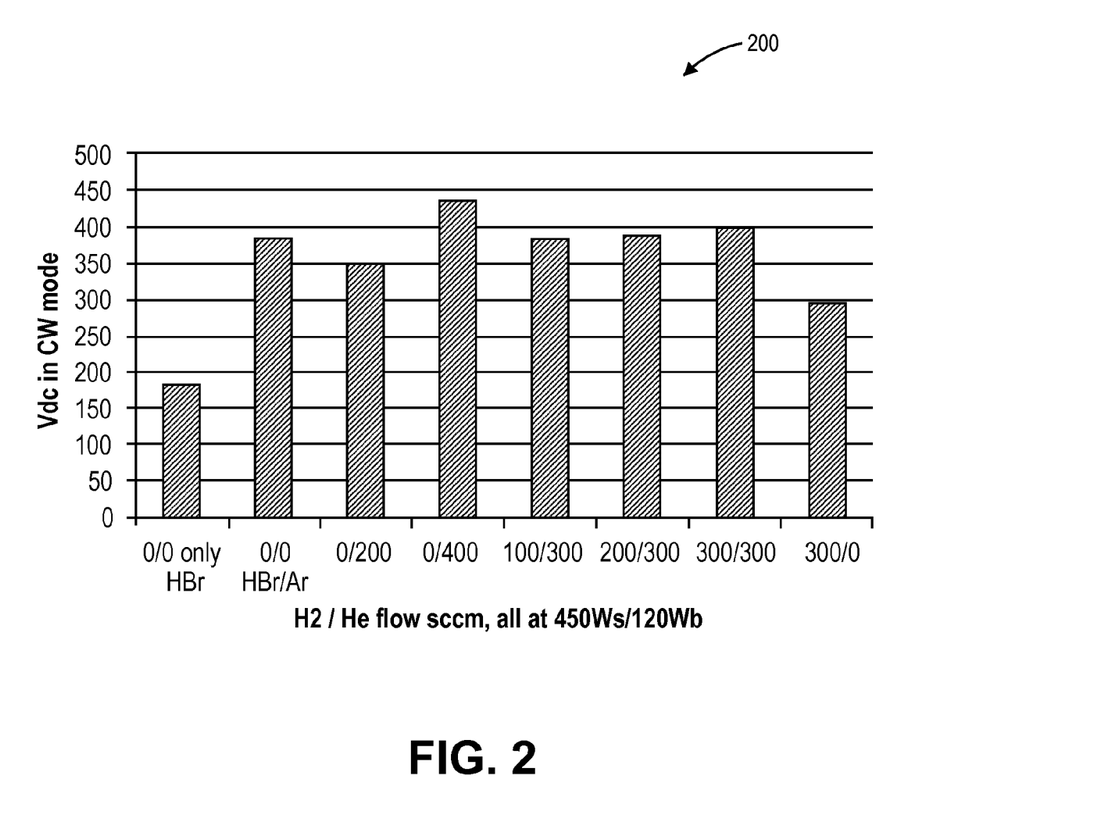
FIG. 2 is a plot of V-I probe measurements as a function of HBr/additive gas mixtures, in accordance with an embodiment of the present invention.

During an etch of finfet or related gate structures, e.g., during etching of the gate electrode 122 of FIG. 1, an essentially vertical gate profile may be required both on top of and in between the fins (as indicated in the schematic in FIG. 2). Typically, approximately 10-50 Angstroms of gate oxide covers the fin. As described above, traditional $HBr/O_2/He$ processes are used at high pressures to gain selectivity to gate dielectric materials. Helium has been used to improve poly-silicon etch rate uniformity and for profile control. However, in order to achieve vertical profiles for finfet gate or other three-dimensional gate structures, particularly polysilicon gate structures, He may have drawbacks. Instead, in accordance with one or more embodiments of the present invention, hydrogen is used at least in a portion of an etch process.

As a comparison, V-I probe measurements for HBr/additive gas mixtures are plotted in FIG. 2, in accordance with an embodiment of the present invention. Referring to plot 200 of FIG. 2, Vdc in continuous wave (CW) mode of a plasma operation was measured for various gas mixtures, i.e., gas dilutions, and ratios of $H_2$/He flows at 70 mT, 450 Ws, 120 Wb. Referring to FIG. 2, He addition increases Vdc due to a high threshold energy for ionization, and smaller collision cross-section. Hence, dilution with He can maintain "fast" electrons, resulting in high ion energies. Such a result can lead to issues with maintaining etch profile and/or undercutting a three-dimensional gate structure. Instead, in an embodiment, as revealed in FIG. 2, substituting $H_2$ for He reduces the Vdc on the wafer, leading to improved profile and less to no undercut. The reduced Vdc can be realized since $H_2$ has nearly half of the ionization threshold as compared with He.

Figure 3:
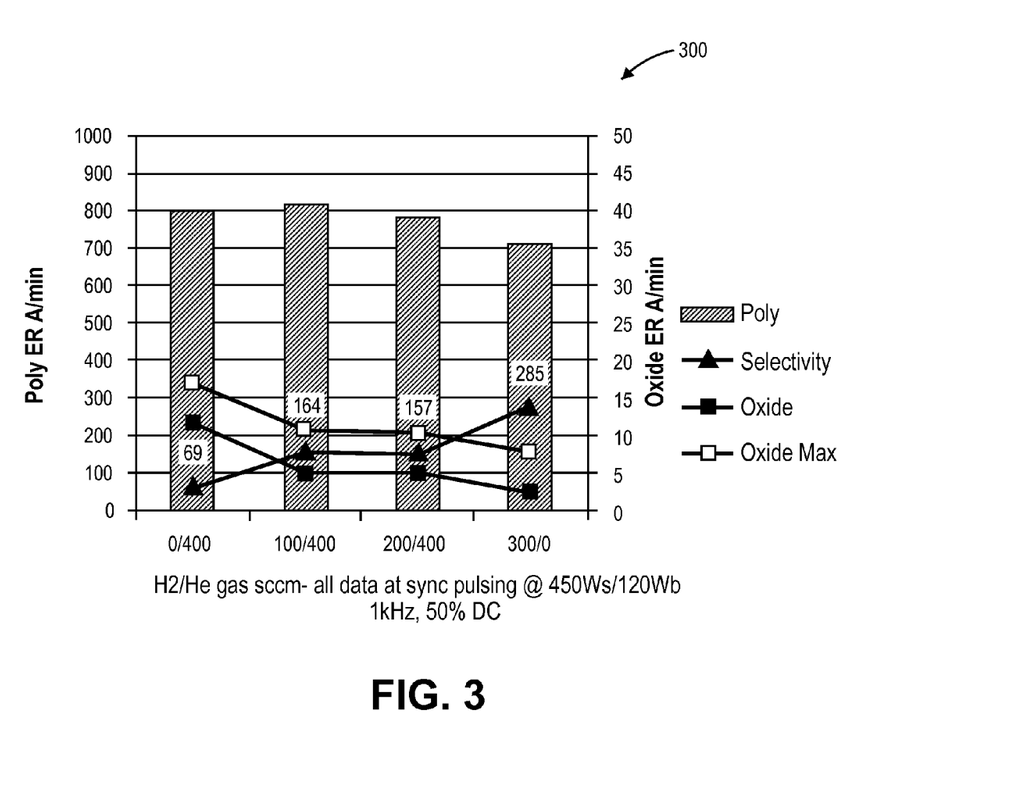
FIG. 3 is a plot revealing the impact on poly/ox etch rate selectivity for substitution of He with hydrogen in a polysilicon over etch (OE) process, in accordance with an embodiment of the present invention.

The substitution of He with $H_2$ may be particularly useful in an over-etch process of a three-dimensional silicon based gate structure. For example, FIG. 3 is a plot 300 revealing the impact on poly/ox etch rate selectivity for substitution of He with hydrogen in a polysilicon over etch (OE) process, in accordance with an embodiment of the present invention. Specifically, polysilicon and oxide etch rates with varying $H_2$ and He flows in a HBr/$O_2$ synchronized plasma at 70 mT, 450 Ws/120 Wb, 1 kHz, 50% DC is provided. Referring to FIG. 3, by using hydrogen as a diluents gas, a higher bias power is used to obtain vertical gate profile with no fin damage. Furthermore, the ion energy distribution function can be manipulated by pulsing the plasma at different modes (e.g., out of phase, or embedded).

Figure 4:
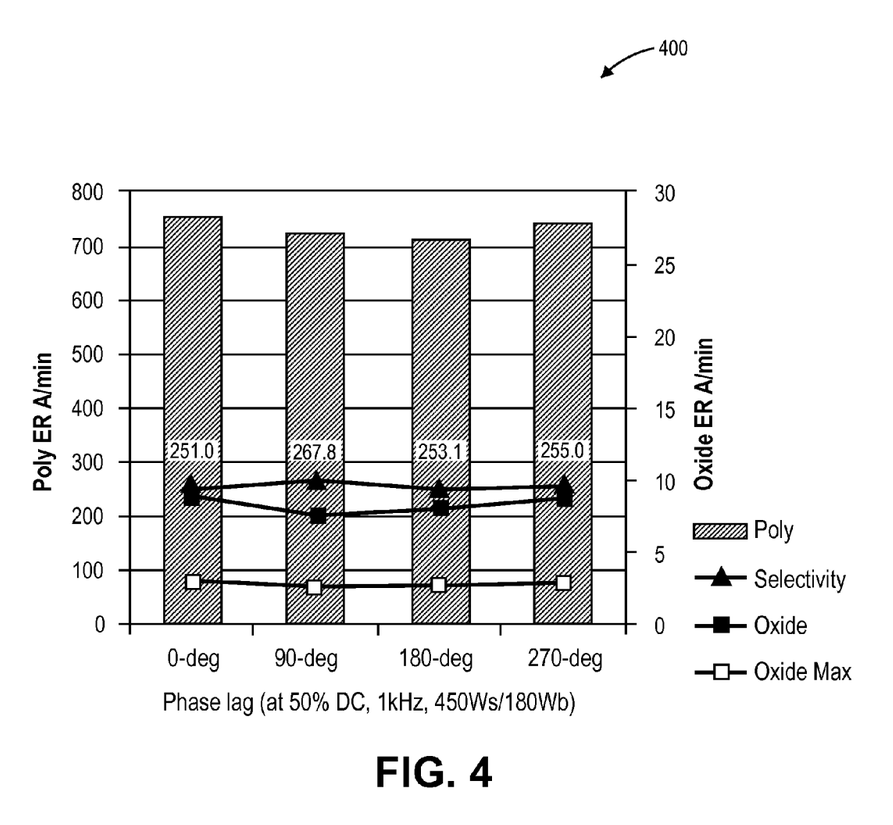
FIG. 4 is a plot revealing the impact of etch rate selectivity with phase lag between source and bias during pulsing, in accordance with an embodiment of the present invention.

Additionally, selectivity of an etch involving hydrogen for polysilicon etching of a three-dimensional gate structure can be tuned as needed. For example, FIG. 4 is a plot 400 revealing the impact of etch rate selectivity with phase lag between source and bias during pulsing, in accordance with an embodiment of the present invention. Specifically, polysilicon and oxide etch rates in HBr/$H_2$/$O_2$ synchronized plasma with Ws and Wb out of phase at 70 mT, 450 Ws/120 Wb, 1 kHz, 50% DC is provided.

Thus, with addition of hydrogen to a pulsed plasma polysilicon over etch process, a vertical to undercut gate profile can be achieved while not damaging the silicon fin. Embodiments may be applicable to etching for three-dimensional gate structures such as finfet etch processing.

Figure 5:
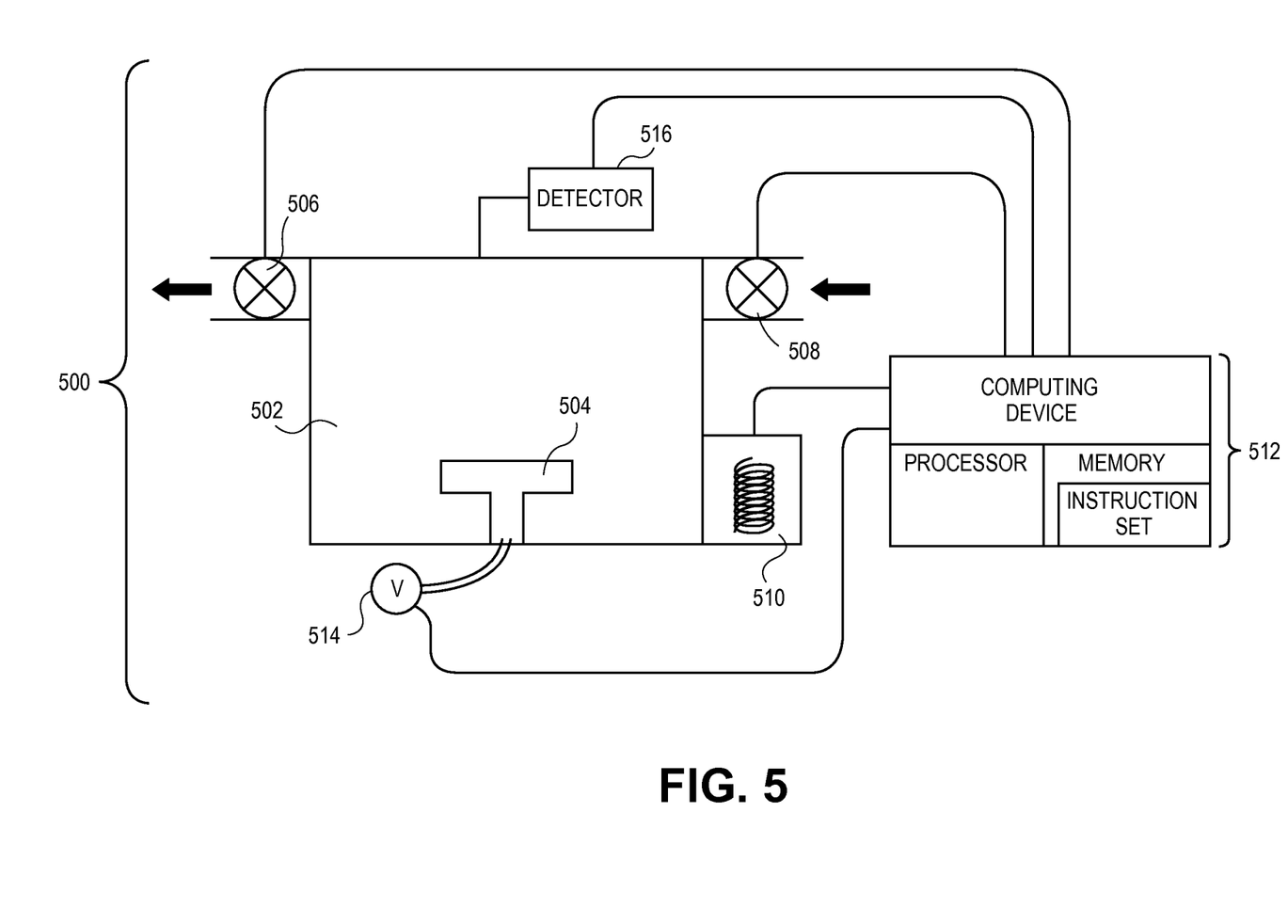
FIG. 5 illustrates a system in which a method of polysilicon over-etch using hydrogen diluted plasma for three-dimensional gate etch can be performed, in accordance with an embodiment of the present invention.

Patterning of a polysilicon layer to form a three-dimensional gate structure may be conducted in processing equipment suitable to provide an etch plasma in proximity to a sample for etching. For example, 5 illustrates a system in which a method of polysilicon over-etch using hydrogen diluted plasma for three-dimensional gate etch can be performed, in accordance with an embodiment of the present invention.

Referring to FIG. 5, a system 500 for conducting a plasma etch process includes a chamber 502 equipped with a sample holder 504. An evacuation device 506, a gas inlet device 508 and a plasma ignition device 510 are coupled with chamber 502. A computing device 512 is coupled with plasma ignition device 510. System 500 may additionally include a voltage source 514 coupled with sample holder 904 and a detector 516 coupled with chamber 502. Computing device 512 may also be coupled with evacuation device 506, gas inlet device 508, voltage source 514 and detector 516, as depicted in FIG. 5.

Chamber 502 and sample holder 504 may include a reaction chamber and sample positioning device suitable to contain an ionized gas, i.e. a plasma, and bring a sample in proximity to the ionized gas or charged species ejected therefrom. Evacuation device 506 may be a device suitable to evacuate and de-pressurize chamber 502. Gas inlet device 508 may be a device suitable to inject a reaction gas into chamber 502. Plasma ignition device 510 may be a device suitable for igniting a plasma derived from the reaction gas injected into chamber 502 by gas inlet device 508. Detection device 516 may be a device suitable to detect an end-point of a processing operation. In one embodiment, system 500 includes a chamber 502, a sample holder 504, an evacuation device 506, a gas inlet device 508, a plasma ignition device 510 and a detector 516 similar to, or the same as, those included in an Applied Centura® Enabler dielectric etch system, an Applied Materials™ AdvantEdge G3 system, or an Applied Materials™ C3 dielectric etch chamber.

In an embodiment, a three-dimensional gate fabrication process is performed in chamber such as chamber 500. The recipe can involve one or more, or all, of the following operations 0-2. In one such embodiment, all operations 0-2 are performed in the sequence provided below and in a single pass in a chamber. In another such embodiment, only operations 1 and 2 are performed in the sequence provided below and in a single pass in a chamber.

At an operation 0, which may or may not be included, a hardmask etch is first performed. In one such embodiment, a hardmask (e.g., as mask 110 of FIG. 1) is composed of a material which may include, but is not limited to, silicon dioxide, silicon nitride and silicon oxy-nitride. The hardmask may be maintained through operations 1 and 2 described below. Additionally processing between operation 0 and operations 1 and 2 below may include ashing and cleaning to remove any photoresist residues.

Operation 1 is a polysilicon main etch (Poly ME) portion performed at a pressure approximately in the range of 4-10 mTorr, a source power approximately in the range of 300-1000 W, a bias power approximately in the range of 0-100 W, and a chemistry based on $SF_6$ (approximately 10-70 sccm), $N_2$ (approximately 50-200 sccm), $CH_2F_2$ (approximately 25-75 sccm), and He (approximately 0-500 sccm), at a temperature approximately in the range of 20-80 degrees Celsius. In a specific embodiment, the Poly ME etch portion is performed at a pressure of approximately 6 mTorr, a source power of approximately 600 W, a bias power of approximately 40 W, and a chemistry based on $SF_6$ (approximately 35 sccm), $N_2$ (approximately 90 sccm), $CH_2F_2$ (approximately 68 sccm), and He (approximately 200 sccm), at a temperature of approximately 60 degrees Celsius. The above poly ME operation is typically ended by target thickness etched. This operation can also involve traditional HBr/$O_2$ chemistry (e.g., 6 mT, 400 W source power, 100 W bias power, 180 HBR, 3 sccm $O_2$) or HBr/$Cl_2$ (30 sccm $Cl_2$)/$O_2$.

Operation 2 is a polysilicon over etch (Poly OE) portion performed at a pressure approximately in the range of 40-100 mTorr, a source power approximately in the range of 300-1000 W, a bias power approximately in the range of 80-250 W, and a chemistry based on $O_2$ (approximately 3-15 sccm), HBr (approximately 100-500 sccm), and $H_2$ (approximately in the range between 0-500 sccm), at a temperature approximately in the range of 20-80 degrees Celsius. In a specific embodiment, the Poly OE etch portion is performed at a pressure of approximately 70 mTorr, a source power of approximately 450 W, a bias power of approximately 180 W, and a chemistry based on $O_2$ (approximately 9 sccm), HBr (approximately 300 sccm), and $H_2$ (approximately 300 sccm), at a temperature of approximately 45 degrees Celsius. The source power and bias power can be continuous or pulsed or one can be continuous and one can be pulsed (e.g., source pulsing or bias pulsing or both pulsing). In one such example, the pulsing frequency used is approximately 1000 Hz (or in a range of 50 Hz-5000 Hz), and approximately 50% duty cycle (or in a range of 10%-90%).

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
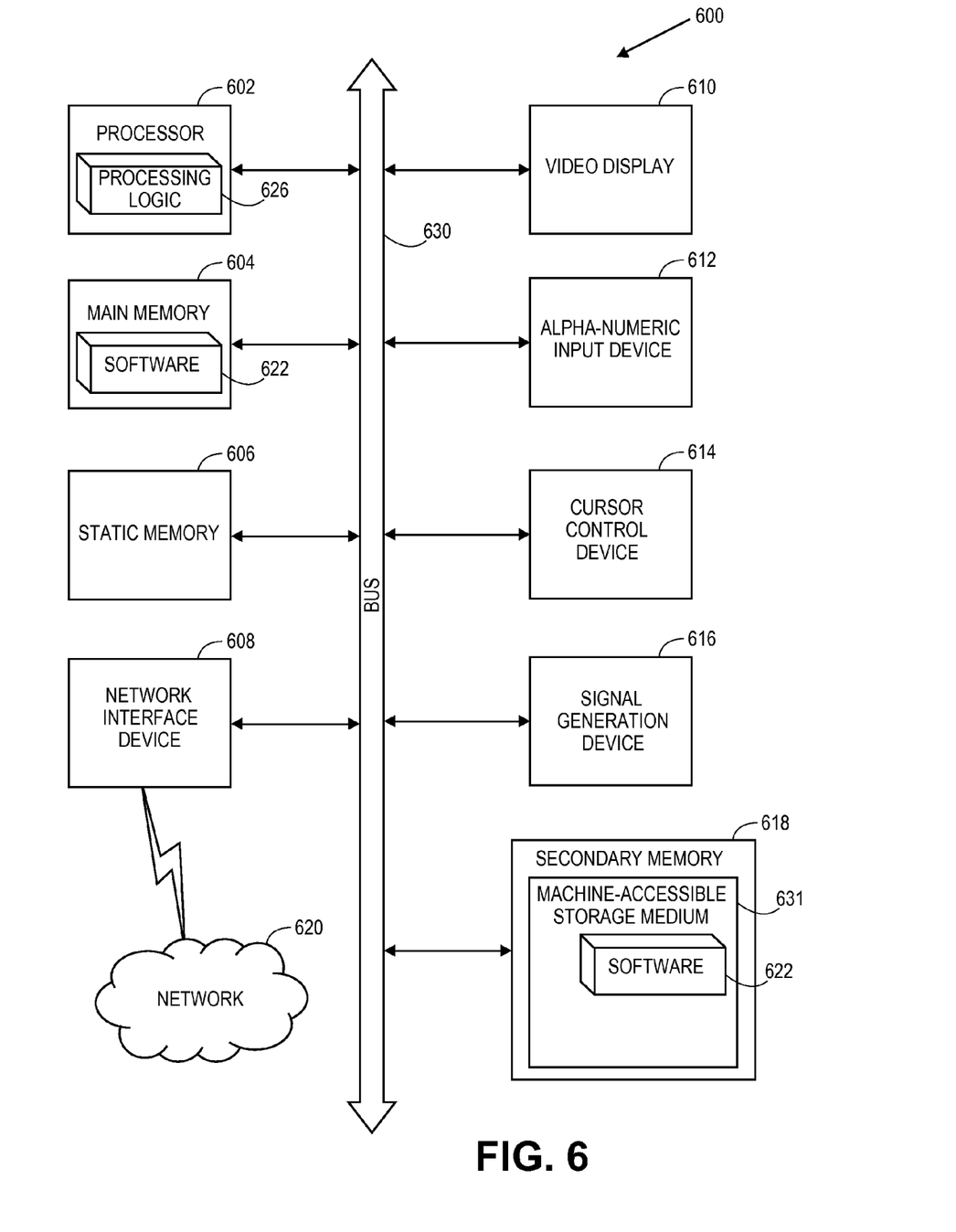
FIG. 6 illustrates a block diagram of an exemplary computer system, in accordance with an embodiment of the present invention.

FIG. 6 illustrates a diagrammatic representation of a machine in the exemplary form of a computer system 600 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In one embodiment, computer system 600 is suitable for use as computing device 512 described in association with FIG. 5.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations discussed herein.

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a non-transitory machine-accessible storage medium has instructions stored thereon which cause a data processing system to perform a method of forming a three-dimensional gate structure. The method includes performing a main plasma etch on a masked polysilicon layer formed over a semiconductor fin. The method also includes, subsequently, performing a plasma over etch on the masked polysilicon layer based on a plasma generated from gaseous composition including hydrogen gas ($H_2$).

In one embodiment, the main plasma etch is performed at a pressure approximately in the range of 4-10 mTorr, a source power approximately in the range of 300-1000 W, a bias power approximately in the range of 0-100 W, and with a chemistry based on $SF_6$ (approximately 10-70 sccm), $N_2$ (approximately 50-200 sccm), $CH_2F_2$ (approximately 25-75 sccm), and He (approximately 0-500 sccm), at a temperature approximately in the range of 20-80 degrees Celsius.

In one embodiment, the main plasma etch is performed at a pressure of approximately 6 mTorr, a source power of approximately 600 W, a bias power of approximately 40 W, and with a chemistry based on $SF_6$ (approximately 35 sccm), $N_2$ (approximately 90 sccm), $CH_2F_2$ (approximately 68 sccm), and He (approximately 200 sccm), at a temperature of approximately 60 degrees Celsius.

In one embodiment, the plasma over etch is performed at a pressure approximately in the range of 40-100 mTorr, a source power approximately in the range of 300-1000 W, a bias power approximately in the range of 80-250 W, and with a chemistry based on $O_2$ (approximately 3-15 sccm), HBr (approximately 100-500 sccm), and $H_2$ (approximately in the range between 0-500 sccm), at a temperature approximately in the range of 20-80 degrees Celsius.

In one embodiment, the plasma over etch is performed at a pressure of approximately 70 mTorr, a source power of approximately 450 W, a bias power of approximately 180 W, and with a chemistry based on $O_2$ (approximately 9 sccm), HBr (approximately 300 sccm), and $H_2$ (approximately 300 sccm), at a temperature of approximately 45 degrees Celsius.

In one embodiment, the main plasma etch is performed at a pressure approximately in the range of 4-10 mTorr, a source power approximately in the range of 300-1000 W, a bias power approximately in the range of 0-100 W, and with a chemistry based on $SF_6$ (approximately 10-70 sccm), $N_2$ (approximately 50-200 sccm), $CH_2F_2$ (approximately 25-75 sccm), and He (approximately 0-500 sccm), at a temperature approximately in the range of 20-80 degrees Celsius, and the plasma over etch is performed at a pressure approximately in the range of 40-100 mTorr, a source power approximately in the range of 300-1000 W, a bias power approximately in the range of 80-250 W, and with a chemistry based on $O_2$ (approximately 3-15 sccm), HBr (approximately 100-500 sccm), and $H_2$ (approximately in the range between 0-500 sccm), at a temperature approximately in the range of 20-80 degrees Celsius.

In one embodiment, the main plasma etch and the plasma over etch are performed in a single pass in an etch chamber.

Thus, methods of polysilicon over-etch using hydrogen diluted plasma for three-dimensional gate etch have been disclosed.

What is claimed is:

1. A method of forming a three-dimensional gate structure, the method comprising:
    performing a main plasma etch on a masked polysilicon layer formed over a semiconductor fin, wherein the main plasma etch is performed at a pressure of approximately 6 mTorr, a source power of approximately 600 W, a bias power of approximately 40 W, and with a chemistry based on $SF_6$ (approximately 35 sccm), $N_2$ (approximately 90 sccm), $CH_2F_2$ (approximately 68 sccm), and He (approximately 200 sccm), at a temperature of approximately 60 degrees Celsius; and, subsequently,
    performing a plasma over etch on the masked polysilicon layer based on a plasma generated from gaseous composition including hydrogen gas ($H_2$).

2. The method of claim 1, wherein the plasma over etch is performed at a pressure approximately in the range of 40-100 mTorr, a source power approximately in the range of 300-1000 W, a bias power approximately in the range of 80-250 W, and with a chemistry based on $O_2$ (approximately 3-15 sccm), HBr (approximately 100-500 sccm), and $H_2$ (approximately in the range between 0-500 sccm), at a temperature approximately in the range of 20-80 degrees Celsius.

3. The method of claim 2, wherein the plasma over etch is performed at a pressure of approximately 70 mTorr, a source power of approximately 450 W, a bias power of approximately 180 W, and with a chemistry based on $O_2$ (approximately 9 sccm), HBr (approximately 300 sccm), and $H_2$ (approximately 300 sccm), at a temperature of approximately 45 degrees Celsius.

4. A method of etching a sample in an etch chamber, the method comprising:
    introducing a substrate into an etch chamber, the substrate comprising a hardmask layer disposed on a polysilicon layer disposed over a plurality of semiconductor fins;
    in a first operation in the etch chamber, etching the hardmask layer to provide a patterned hardmask layer disposed on the polysilicon layer; and
    in a second operation in the etch chamber, performing a main plasma etch on a polysilicon layer having the patterned hardmask thereon, wherein the main plasma etch is performed at a pressure of approximately 6 mTorr, a source power of approximately 600 W, a bias power of approximately 40 W, and with a chemistry based on $SF_6$ (approximately 35 sccm), $N_2$ (approximately 90 sccm), $CH_2F_2$ (approximately 68 sccm), and He (approximately 200 sccm), at a temperature of approximately 60 degrees Celsius; and
    in a third operation in the etch chamber, performing a plasma over etch on the polysilicon layer having the patterned hardmask thereon to form a three-dimensional gate structure, the plasma over etch based on a plasma generated from gaseous composition including hydrogen gas ($H_2$).

5. The method of claim 4, wherein the hardmask layer comprises a material selected from the group consisting of silicon dioxide, silicon nitride and silicon oxy-nitride.

6. The method of claim 4, further comprising:
    subsequent to the first operation and prior to the first operation, performing an ashing and cleaning operation.

7. The method of claim 4, wherein the plasma over etch is performed at a pressure approximately in the range of 40-100 mTorr, a source power approximately in the range of 300-1000 W, a bias power approximately in the range of 80-250 W, and with a chemistry based on $O_2$ (approximately 3-15 sccm), HBr (approximately 100-500 sccm), and $H_2$ (approximately in the range between 0-500 sccm), at a temperature approximately in the range of 20-80 degrees Celsius.

8. The method of claim 7, wherein the plasma over etch is performed at a pressure of approximately 70 mTorr, a source power of approximately 450 W, a bias power of approximately 180 W, and with a chemistry based on $O_2$ (approximately 9 sccm), HBr (approximately 300 sccm), and $H_2$ (approximately 300 sccm), at a temperature of approximately 45 degrees Celsius.

9. A method of forming a three-dimensional gate structure, the method comprising:
    performing a main plasma etch on a masked polysilicon layer formed over a semiconductor fin; and, subsequently,
    performing a plasma over etch on the masked polysilicon layer based on a plasma generated from gaseous composition including hydrogen gas ($H_2$), wherein the plasma over etch is performed at a pressure of approximately 70 mTorr, a source power of approximately 450 W, a bias power of approximately 180 W, and with a chemistry based on $O_2$ (approximately 9 sccm), HBr (approximately 300 sccm), and $H_2$ (approximately 300 sccm), at a temperature of approximately 45 degrees Celsius.

10. The method of claim 9, wherein the main plasma etch is performed at a pressure approximately in the range of 4-10 mTorr, a source power approximately in the range of 300-1000 W, a bias power approximately in the range of 0-100 W, and with a chemistry based on $SF_6$ (approximately 10-70 sccm), $N_2$ (approximately 50-200 sccm), $CH_2F_2$ (approximately 25-75 sccm), and He (approximately 0-500 sccm), at a temperature approximately in the range of 20-80 degrees Celsius.

11. A method of etching a sample in an etch chamber, the method comprising:

introducing a substrate into an etch chamber, the substrate comprising a hardmask layer disposed on a polysilicon layer disposed over a plurality of semiconductor fins;

in a first operation in the etch chamber, etching the hardmask layer to provide a patterned hardmask layer disposed on the polysilicon layer; and in a second operation in the etch chamber, performing a main plasma etch on a polysilicon layer having the patterned hardmask thereon; and in a third operation in the etch chamber, performing a plasma over etch on the polysilicon layer having the patterned hardmask thereon to form a three-dimensional gate structure, the plasma over etch based on a plasma generated from gaseous composition including hydrogen gas ($H_2$), wherein the plasma over etch is performed at a pressure of approximately 70 mTorr, a source power of approximately 450 W, a bias power of approximately 180 W, and with a chemistry based on $O_2$ (approximately 9 sccm), HBr (approximately 300 sccm), and $H_2$ (approximately 300 sccm), at a temperature of approximately 45 degrees Celsius.

12. The method of claim 11, wherein the hardmask layer comprises a material selected from the group consisting of silicon dioxide, silicon nitride and silicon oxy-nitride.

13. The method of claim 11, further comprising:
subsequent to the first operation and prior to the first operation, performing an ashing and cleaning operation.

14. The method of claim 11, wherein the main plasma etch is performed at a pressure approximately in the range of 4-10 mTorr, a source power approximately in the range of 300-1000 W, a bias power approximately in the range of 0-100 W, and with a chemistry based on $SF_6$ (approximately 10-70 sccm), $N_2$ (approximately 50-200 sccm), $CH_2F_2$ (approximately 25-75 sccm), and He (approximately 0-500 sccm), at a temperature approximately in the range of 20-80 degrees Celsius.

* * * * *